(12) United States Patent
Thomaschewski et al.

(10) Patent No.: US 9,196,095 B2
(45) Date of Patent: Nov. 24, 2015

(54) METHOD FOR THE PREPARATION OF A DIGITAL MOCK-UP OF A PLURALITY OF OBJECTS IN AN INSTALLATION SPACE

(76) Inventors: Oliver Sascha Thomaschewski, Norderstedt (DE); Christoph Schafer, Hamburg (DE)

( * ) Notice: Subject to any disclaimer, the term of this patent is extended or adjusted under 35 U.S.C. 154(b) by 503 days.

(21) Appl. No.: 13/536,155

(22) Filed: Jun. 28, 2012

(65) Prior Publication Data
US 2013/0006590 A1 Jan. 3, 2013

(30) Foreign Application Priority Data
Jun. 29, 2011 (DE) .......................... 10 2011 105 931

(51) Int. Cl.
*G06F 17/50* (2006.01)
*G06T 19/20* (2011.01)

(52) U.S. Cl.
CPC ............ *G06T 19/20* (2013.01); *G06F 17/5009* (2013.01); *G06T 2210/04* (2013.01); *G06T 2210/12* (2013.01); *G06T 2210/21* (2013.01)

(58) Field of Classification Search
CPC . G06T 19/20; G06T 2210/04; G06T 2210/21; G06T 2210/12; G06T 17/00; G06T 15/00; G06F 17/5009; G06F 17/50; G06F 17/5095; G01B 11/03; G01B 21/04; G01B 11/24; B64F 5/00; G01S 17/89; B64C 1/066
USPC ...................................................... 703/1, 2, 8
See application file for complete search history.

(56) References Cited

U.S. PATENT DOCUMENTS

| | | | |
|---|---|---|---|
| 8,379,017 B2 * | 2/2013 | Fransson et al. ............... | 345/420 |
| 2005/0203718 A1 | 9/2005 | Carek et al. | |
| 2008/0004843 A1 | 1/2008 | Cabrera | |
| 2009/0135179 A1 * | 5/2009 | Vartanian ....................... | 345/419 |
| 2010/0148002 A1 * | 6/2010 | Park et al. ................... | 244/118.5 |
| 2012/0303336 A1 * | 11/2012 | Becker et al. ..................... | 703/1 |

FOREIGN PATENT DOCUMENTS

WO 2013/000703 1/2013

OTHER PUBLICATIONS

Drews et al. ("A System for Digital Mock-up's and Virtual Prototype Design in Industry: 'The Virtual Workbench'",IEEE, 1997).*
Chaudhuri et al. ("A simple method for fitting of bounding rectangle to closed regions", Elsevier, 2007).*
Semenov et al. ("Combined strategy for efficient collision detection in 4D planning applications", ICCCBE, 2010).*
Kriegel et al. hereafter Kriegel ("Database support for concurrent digital mock-up", University of Munich, 1998).*
Anonymous. "2D Platformer Advanced Collision Detection," as accessed from: http://www.hobbygamedev.com/adv/2d-platformer-advanced-collision-detection/ on Apr. 9, 2013.
(Continued)

*Primary Examiner* — Omar Fernandez Rivas
*Assistant Examiner* — Iftekhar Khan
(74) *Attorney, Agent, or Firm* — Casimir Jones, S.C.

(57) ABSTRACT

The invention relates to a method for compiling a digital mockup of a multiplicity of objects in an installation space, comprising allocating an installation location for each object, determine neighboring objects and object types for each object, and determining possible interactions between neighboring objects.

8 Claims, 3 Drawing Sheets

(56) References Cited

OTHER PUBLICATIONS

Dolezal, "Success Factor for Digital Mock-ups (DMU) in complex Aerospace Product Development," Technische Universität München, Genehmigten Dissertation, Munich, Germany, 2008.

Goldsmith and Salmon, "Automatic Creation of Object Hierarchies for Ray Tracing," Computer Graphics and Applications, IEEE, 1987, 7(5): 14-20.

Liu et al., "Constrained behavior manipulation for interactive assembly in a virtual environment." The International Journal of Advanced Manufacturing Technology, 2007, 32: 797-810.

* cited by examiner

Fig. 3

Generic matrix of the interactions

|  | Wall | Ceiling | O2 box | O2 line | O2 cylinder | Electrical line | Lamp |
|---|---|---|---|---|---|---|---|
| Wall |  | 1 | 2 | 3 | 4 | 5 | 6 |
| Ceiling |  |  | 7 | 8 | 9 | 10 | 11 |
| O2 box |  |  |  | 12 | 13 | 14 | 15 |
| O2 line |  |  |  |  | 16 | 17 | 18 |
| O2 cylinder |  |  |  |  |  | 19 | 20 |
| Electrical line |  |  |  |  |  |  | 21 |
| Lamp |  |  |  |  |  |  |  |

Fig. 4

Result of the spatial proximity analysis

|  | Wall | Ceiling | O2 box | O2 line | O2 cylinder | Electrical line | Lamp |
|---|---|---|---|---|---|---|---|
| Wall |  | x |  |  |  |  |  |
| Ceiling |  |  | x | x |  |  |  |
| O2 box |  |  |  | x |  |  |  |
| O2 line |  |  |  |  | x | x | x |
| O2 cylinder |  |  |  |  |  |  |  |
| Electrical line |  |  |  |  |  | x | x |
| Lamp |  |  |  |  |  |  |  |

Fig. 5

Correlation of the matrices: black: irrelevant fields

|  | Wall | Ceiling | O2 box | O2 line | O2 cylinder | Electrical line | Lamp |
|---|---|---|---|---|---|---|---|
| Wall |  | 2 |  |  |  |  |  |
| Ceiling |  |  | 5 | 6 |  |  |  |
| O2 box |  |  |  | 10 |  |  |  |
| O2 line |  |  |  |  | 14 | 15 | 16 |
| O2 cylinder |  |  |  |  |  |  |  |
| Electrical line |  |  |  |  |  | 19 | 20 |
| Lamp |  |  |  |  |  |  |  |

METHOD FOR THE PREPARATION OF A DIGITAL MOCK-UP OF A PLURALITY OF OBJECTS IN AN INSTALLATION SPACE

The present invention claims priority to German Patent Application 10 2011 105 931.1, filed Jun. 29, 2011.

The invention relates to a method for compiling a digital mockup of a multiplicity of objects in an installation space.

In a complex construction process, for example planning the fitting out of the interior of an airplane, a so-called digital mockup is generally compiled. This term refers, in the context of the present invention, to a computer-aided test model which represents the structure of the objects in the installation space (modules and individual parts) and their positionally accurate geometry. The compilation of such a digital mockup is a component of so-called virtual product development.

It is an object of the invention to provide a method of the type mentioned in the introduction, which makes it possible to check such a digital mockup for interactions of objects arranged therein, extending beyond a simple check for possibly spatial interactions, for example collisions.

The method according to the invention comprises the following steps:
  a) allocating an installation location for each object,
  b) carrying out a vicinity search around each object in order to determine neighboring objects,
  c) compiling a first dataset which contains the neighboring objects for each object,
  d) providing a second dataset which, for each object type, contains queries about possible interactions with other object types,
  e) correlating the first and second datasets so that, for each object, a query list is compiled which contains queries from the second dataset for those objects or object pairs which are identified as neighboring in the first dataset.

First, some of the terms used in the context of the invention will be explained.

In the context of this invention, the term digital mockup is used as defined in the introduction. An installation space is a spatially defined region in which a multiplicity of objects are intended to or must be arranged. In the context of the invention, such an installation space is preferably a defined space, in particular an interior, of a means of transport, more preferably an airplane.

The term objects refers to components or modules which are intended to be arranged in this installation space. When fitting out an airplane cabin, these objects may for example be modules of floors, walls or ceilings, so-called monuments such as seats, galleys, toilets or the like, functional modules such as parts of the lighting, air conditioning, water supply and disposal, entertainment systems or the like.

According to the invention, the objects are assigned to various object types. For fitting out the interior of an airplane cabin, object types may for example be selected from the group consisting of installed furniture; emergency equipment; signs/displays; tables; moving doors; cables or pipes; floor elements; toilets (lavatories); seating furniture and beds; ceiling elements; air outlet openings; nozzles and air-conditioning devices; galleys; loudspeakers; lighting devices: cladding and dampening elements, for example sound insulation elements; window shades; carpet floor elements, floor elements and floor elements with a special function (for example mounting openings); fastening elements for furniture and other equipment objects such as seats or the like; seat rails; racks for electrical and electronic components; water supply and discharge lines and vacuum lines for toilet systems; tanks such as water tanks; ion exchangers; sensors in the cabin interior such as motion detectors and the like; emergency systems such as oxygen containers, oxygen lines, oxygen masks and the like; medical devices, in particular emergency devices; ventilators; air heating devices; control panels for cabin systems, for example air conditioning; maintenance accesses; openings and flaps; air humidifiers; electrical and electronic systems and components for the function of the airplane and/or for comfort, communication and entertainment purposes; energy supply systems, in particular lines. This list is not exhaustive and mentions possible grouping of object types by way of example. Two objects are preferably assigned to different object types when there may be an interrelation between these objects, which raises a query to be checked (feature e) of claim 1). For example, electrical lines must be at a predetermined minimum distance from oxygen lines in the airplane interior. Electrical lines and oxygen lines are therefore not assigned to a common object type: "lines", but instead two different object types are provided for these two objects so that a corresponding query can be raised in the course of the method according to the invention.

The term vicinity search refers to a computer-aided determination of spatially neighboring objects. The conduct of such a vicinity search is conventional in the prior art and it is carried out, for example, by conventional CAD programs on the basis of a so-called clash analysis. An example of a commercially available CAD program, which can carry out such a clash analysis, is the CAD program CATIA (Computer Aided Three-Dimensional Interactive Application) from Dassault Systemes, which was developed for airplane construction but has now also been extended to other fields. Although the clash analysis per se merely searches for penetrations of objects, in the vicinity search it is possible to use clash analysis methods in which the search extends not only to penetrations or contacts of objects but also to objects in a defined vicinity. A vicinity search is also integrated in other commercially available software, for example DMU programs or PDM programs (Product Data Management).

With the aid of such a program, the first dataset which contains the neighboring objects for each object may be compiled according to feature c) of claim 1. Further reference will be made below to possible definitions and determinations of the criterion "neighboring".

The second dataset is a collection of queries about possible interactions between object types. These queries are compiled on the basis of practical experiences and the effects of specifications, for example safety specifications. An example which may be mentioned here is the aforementioned query about compliance with the minimum distance (safety distance) between the object types: oxygen line and electrical line. The second dataset is therefore a collection of queries about relevant interactions of spatially neighboring objects, which is subdivided and structured with the aid of the object types.

The crucial aspect of the present invention resides in the correlation of the two datasets according to feature e) of claim 1. After an (optionally provisional) installation location has been allocated to each object, the spatially neighboring objects are first determined for each object and placed in the first dataset. Subsequently, a correlation with the second dataset is carried out in respect of whether, for objects identified as neighboring in the first dataset, interactions requiring attention exist for the object types, with which these two objects are respectively associated, and need to be checked or taken into account. In this case, the second dataset contains a corresponding query. As a result, a query list is therefore compiled which contains all interactions to be checked for the installation locations allocated in step a) of claim 1 and therefore for the entire configuration compiled in the digital mockup, and which subsequently can and must be processed. The effect of this systematization of the checking and validation, for example of the fitting out of the interior of an airplane cabin, is that the relevant points to be checked are determined automatically and no necessary check is omitted. The invention therefore makes it possible to make the planning and safeguarding of the fitting out controllable, with the planning status being transparent at any time and knowledge generated in the planning process being safeguarded continuously.

On the other hand, it ensures that no superfluous queries about possible interactions need to be raised and checked, since a query for the query list, or a safety task, is only generated in the event of a positive vicinity search (first dataset) and an interaction of two object types which is possible in principle (second dataset).

At an early stage in the planning process, the details for all objects or object types may possibly not yet be established. For each object not yet known in detail, it may therefore be expedient to first provide a placeholder which allows a first check as to what interactions may possibly occur with other objects.

According to the invention, the query list may be subdivided into a plurality of query lists or so-called safety tasks according to various criteria. For example, the person responsible for the installation of a particular object or object type may be provided with all queries which relate to the objects under his responsibility. This may be done in the form of the aforementioned safety tasks, in which case these subsequently need to be checked and the corresponding queries need to be answered. The conduct of the check may be confirmed with the safety tasks and therefore documented. In the context of the invention, the determination of neighboring objects may be carried out by means of the so-called bounding-box method. This is a method known from the prior art, which is described for example in Jeffrey Holdsmith, John Salmon: Automatic Creation of Object Hierarchies for Ray Tracing In: Proceedings of IEEE Symposium on Computer Graphics and Applications, May 1987, pages 14-20, ISSN 0272-1716. A so-called bounding volume in the algorithmic geometry is a simple geometrical body, which encloses a complex three-dimensional object or a complex body. In the context of the invention, such a bounding volume may be formed as a sphere (bounding sphere), but preferably as a cuboid or cube (bounding box). In the context of the invention, it is optionally also possible to use polyhedra, which can enclose complex objects better (more tightly).

In the context of the invention, it is possible to make a bounding box larger, so that it not only encloses the corresponding object but additionally contains a distance from the object boundaries and in this way, so to speak, enlarges the object for the purpose of the vicinity search or clash analysis. In the context of the invention, an enclosing cuboid may preferably be extended in one or more spatial directions relative to the enclosed object by from 0.1 to 1 m, preferably from 0.2 to 0.7 m, more preferably from 0.4 to 0.6 m, in particular about 0.5 m. If the correspondingly enlarged bounding boxes comprise mutually overlapping coordinate ranges in the scope of the vicinity search or clash analysis, the corresponding objects are identified as neighboring in the sense of feature b) of claim 1. The effect achieved by the described enlargement of the bounding box is that even objects having a defined maximum distance from one another are still identified as neighboring. This can be expedient since interactions to be checked between various object types may also occur when two objects are at a distance from one another. Examples which may be mentioned of such interactions to be checked even at a certain distance are the accessibility of maintenance openings, the tiltability of doors or flaps or the like. In the context of the invention, it may likewise be preferable to check two or more distance ranges in the vicinity search. If, for example, a minimum distance of 0.2 m is prescribed according to a construction specification for a particular pairing of two object types, and a minimum distance of 0.4 m for a different pairing of object types, it may be expedient for example to provide a vicinity search both in the range of from 0.1 to 0.3 m and in the range of from 0.3 to 0.5 m for the corresponding pairings of object types. If a minimum distance of 0.2 m is prescribed for example by a construction specification for one object type pairing, two corresponding objects must a priori not be identified as neighboring if they only lie in the "distance class" from 0.3 to 0.5 m in the vicinity search.

In the context of the invention, the first and/or second datasets may in particular be formed as a two-dimensional matrix. The first matrix may be a square matrix, the number n of rows and columns corresponding to the number of objects to be arranged in the installation space. The matrix components may for example take the values 0 and 1, the value 1 indicating that the corresponding objects (associated rows and columns of the matrix) are neighboring in the sense of feature b) of claim 1.

The matrix of the second dataset may likewise be a square matrix, the number of rows and columns corresponding to the number of object types to be taken into account. Each component in this matrix then corresponds to a pairing of two object types, and in this matrix component it is possible to store whether there is an interaction and optionally the queries which are to be answered in the event of an interaction of the two object types. The corresponding matrix entry may be empty, or the corresponding matrix component may be set as null, when an interaction between two object types is ruled out. When fitting out the interior airplane cabins, for example, no interaction is possible between the object type: wall or wall panel, on the one hand, and an oxygen cylinder on the other hand, since oxygen cylinders are always arranged underneath the cabin floor and for this reason no meaningful query about an interaction with the wall or wall elements is possible. The dimension of the matrix of possible interactions between object types corresponds to the number of object types present. In the context of the invention, in the course of the correlation of the first and second datasets, an intermediate step may be expedient which involves setting up a matrix that contains possible interactions of the specific objects when one object type is respectively assigned to these objects. To this end, for each object, the object type is established and, as the second dataset, a square matrix is compiled whose dimension corresponds to the number of objects and is therefore identical to the dimension of the matrix of the first dataset. In this second matrix, an object type is then assigned to each object and the possible interactions with all other objects, or the corresponding queries, are listed.

The queries about possible interactions of two object types are based on the experiences obtained in practice about possible interactions, collisions and incompatibilities. The queries may, in particular, be selected from the following categories:

a) is the function ensured?
b) is there enough free space from the surroundings?
c) are there interfaces and are these compatible with one another?
d) is the object mountable?
e) is the object accessible for maintenance purposes?
f) is the object accessible and controllable?

Further query categories may likewise be envisaged. If the desire is to have information about all of the possible collisions, the query concerning a collision (contact) between two objects may for example also be raised.

Often, when a digital mockup is being compiled according to the invention, it will be found that undesired interactions occur which require modification of the installation location of one or more objects. In the context of the invention, the method may then be carried out iteratively by allocating a new installation location to one or more objects, preferably those objects for which the response to the output query list reveals a collision or incompatibility with another object, and compiling a digital mockup according to claim 1 repeatedly in order to carry out the corresponding check for the new installation situation. This iteration may be repeated until a collision of objects is no longer revealed in the response to the query list (including other incompatibilities).

The invention furthermore relates to a method for fitting out an installation space with objects, this installation space preferably being the interior of a means of transport, such as preferably an airplane. The method comprises the following steps:
 a) compiling a digital mockup of the fitted-out interior by means of a method according to the Claims,
 b) fitting out the interior by arranging the objects at the installation locations determined in step a).

This method therefore relates to the actual fitting out of the installation space with objects, at the installation locations which have been determined during the inventive compilation of a digital mockup.

An exemplary embodiment of the invention will be explained below with the aid of the drawing, in which:

FIG. 1 schematically shows some elements of an airplane cabin;

FIG. 3 shows a second dataset formed as a matrix in which queries about possible interactions with other object types are stored for each object type;

FIG. 4 schematically shows a first matrix (neighboring object types) with the second matrix (interactions of object types) for determining the queries which are relevant in the present installation configuration;

FIG. 5 schematically shows the result of the correlation of the first matrix (neighboring object types) and second matrix (interactions of object types) for determining the queries which are relevant in the present installation configuration.

In the figures and the following description of the figures, various abbreviations will be used.
Object Types:
 W: wall
 D: ceiling
 L: light
 B: oxygen mask container
 O: oxygen line
 E: electrical line
 F: oxygen cylinder If a plurality of objects of one object type are present, these will be numbered.

Figure 1:
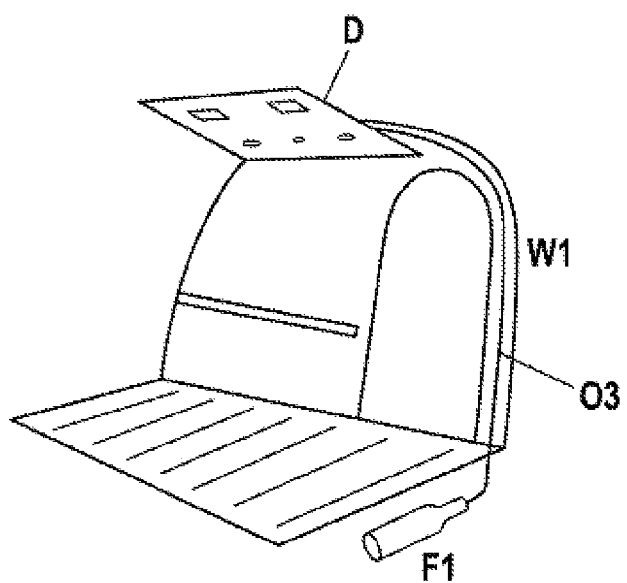

FIG. 1 schematically shows a part of an airplane cabin. A wall element W1 and a ceiling part, denoted overall by D, are represented. Underneath the floor there is an oxygen cylinder F1.

Figure 2:
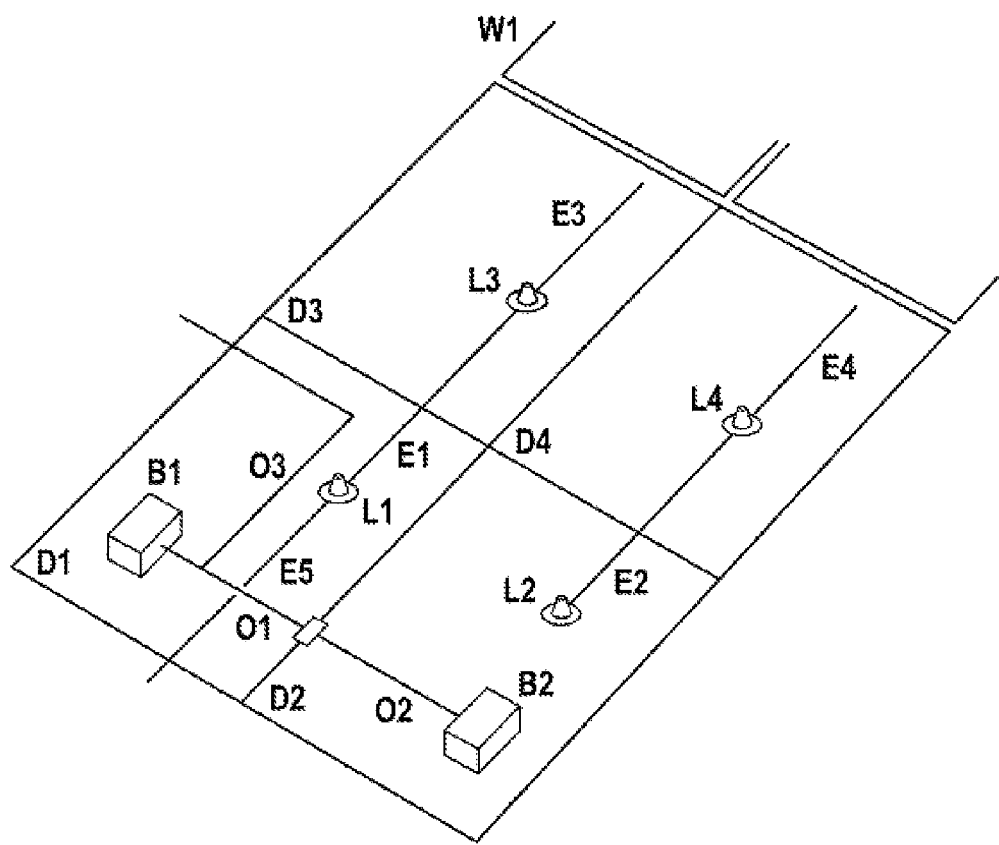
FIG. 2 shows a top view of the ceiling of this cabin with some objects represented.

FIG. 2 schematically shows a top view of the ceiling. Four ceiling elements, or panels, D1 to D4 form this ceiling. At the edge, they abut with the corresponding wall element W1. Four lights L1 to L4 are arranged in the four ceiling panels D1 to D4. These are supplied, or connected to possibly further lights (not shown), by five electrical lines E1 to E5. Two oxygen containers B1 and B2 contain oxygen masks. They are connected by means of the oxygen lines O1 and O2 to a common supply line O3, which leads to the oxygen cylinder F1 underneath the cabin floor (FIG. 1).

In FIGS. 1 and 2, a total of seven object types are represented. FIG. 3 is a 7×7 square matrix, in which the dependencies, interactions, or queries about such interactions, between object types are collated. In the cells for which there is a relevant interaction between the object types involved, a number is entered which makes it possible to identify the relevant questions in a list.

The matrix components represented in FIG. 3 will be explained below. The corresponding component will be explained with reference to the corresponding rows and columns of the matrix.

The questions based on the object types are represented in the following list. An example of an irrelevant entry is:
F-W (oxygen cylinder-wall)

Since an oxygen cylinder is always arranged underneath the cabin floor, no interaction with a wall can take place and, accordingly, no query can be stored for this matrix component. The corresponding entry in the matrix is null. Interactions need not be taken into account.

| Interaction | Query Type | Specific question |
|---|---|---|
| 1 | Interfaces | Are the clearances as required |
|   | Mountability | Can the parts be mounted in this way at this position? |
|   | Free space from the surroundings | Can the parts move relative to one another sufficiently in flight? |
| 2 | Interfaces | Are the clearances as required |
|   | Mountability | Can the parts be mounted in this way at this position? |
|   | Free space from the surroundings | Can the parts move relative to one another sufficiently in flight? |
| 3 | Mountability | Can the parts be mounted in this way at this position? |
|   | Function | Can the O2 box open unimpeded and the masks drop free? |
|   | Maintenance | Is the part accessible for maintenance |
| 4 | Interfaces | Are the clearances as required |
|   | Mountability | Can the parts be mounted in this way at this position? |
|   | Free space from the surroundings | Can the parts move relative to one another sufficiently in flight? |
| 5 | Mountability | Can the parts be mounted in this way at this position? |
|   | Function | Can the O2 box open unimpeded and the masks drop free? |
|   | Maintenance | Is the part accessible for maintenance |
| 6 | Maintenance | Can the O2 line also be separated at the separation points of the ceilings |

-continued

| Interaction | Query Type | Specific question |
|---|---|---|
| 7 | Maintenance | Can the electrical line also be separated at the separation points of the ceilings |
| 8 | Maintenance | Is the part accessible for maintenance |
|  | Mountability | Can the parts be mounted in this way at this position? |
|  | Free space from the surroundings | Is enough free space ensured for the heat dissipation? |
| 9 | Function | Can the O2 box open unimpeded and the masks drop free? |
| 10 | Mountability | Can the parts be mounted in this way at this position? |
|  | Maintenance | Is the part accessible for maintenance |
|  | Interfaces | Does the line meet the box at the correct point? |
| 11 | Free space from the surroundings | Is a minimum distance of 0.1 m complied with? |
| 12 | Free space from the surroundings | Is a minimum distance of 0.1 m complied with? |
|  | Function | Can the O2 box open unimpeded and the masks drop free? |
| 13 | Mountability | Can the parts be mounted in this way at this position? |
|  | Maintenance | Is the part accessible for maintenance |
|  | Interfaces | Do the lines meet one another at the correct point? |
| 14 | Mountability | Can the parts be mounted in this way at this position? |
|  | Maintenance | Is the part accessible for maintenance |
|  | Interfaces | Do the line and cylinder meet one another at the correct point? |
| 15 | Free space from the surroundings | Is a minimum distance of 0.1 m complied with? |
| 16 | Free space from the surroundings | Is a minimum distance of 0.1 m complied with? |
| 17 | Mountability | Can the parts be mounted in this way at this position? |
|  | Free space from the surroundings | Can the parts move relative to one another sufficiently in flight? |
| 18 | Free space from the surroundings | Is a minimum distance of 0.1 m complied with? |
| 19 | Mountability | Can the parts be mounted in this way at this position? |
|  | Maintenance | Is the part accessible for maintenance |
|  | Interfaces | Do the lines meet one another at the correct point? |
| 20 | Mountability | Can the parts be mounted in this way at this position? |
|  | Maintenance | Is the part accessible for maintenance |
|  | Interfaces | Do the line and the lamp meet one another at the correct point? |
| 21 | Free space from the surroundings | Is heat dissipation ensured? |

In the matrix of FIG. 3 and the associated list, all queries which may arise in the course of fitting out the airplane cabin owing to interaction between two object types are therefore compiled. This query list, or matrix, may be supplemented, modified and improved continuously with the aid of additional experience obtained.

FIG. 4 shows the result of the spatial proximity analysis.

In this case, the result of the spatial proximity analysis has been aggregated on an object type basis. Naturally, however, each spatial proximity of all the objects is evaluated, which would give an 18×18 matrix here.

The two matrices can now be correlated and evaluated. The matrix of the relevant dependencies at the object type level is represented in FIG. 5, and is obtained as follows: if the second dataset, the matrix of the interactions, comprises an interaction at a position and the spatial proximity matrix comprises a proximity for the specific example, then this dependency and therefore the queries for at least one object pairing in the specific case are relevant.

Then, the relevant dependencies need to be compiled to form safety tasks for all relevant objects.

By way of example, these will be listed for the electrical line E2. The line E2 is in spatial proximity to the following objects:
D2
D4
L2
L4
B2
O3
O1

The following relevant safety tasks can now be compiled specifically in accordance with the generic query list:

| | | | |
|---|---|---|---|
| E2 | D2 | Maintenance | Can the electrical line also be separated at the separation points of the ceilings |
| E2 | D4 | Maintenance | Can the electrical line also be separated at the separation points of the ceilings |
| E2 | L2 | Mountability | Can the parts be mounted in this way at this position? |
| E2 | L2 | Maintenance | Is the part accessible for maintenance |
| E2 | L2 | Interfaces | Do the line and the lamp meet one another at the correct point? |
| E2 | L4 | Mountability | Can the parts be mounted in this way at this position? |
| E2 | L4 | Maintenance | Is the part accessible for maintenance |
| E2 | L4 | Interfaces | Do the line and the lamp meet one another at the correct point? |
| E2 | B2 | Free space from the surroundings | Is a minimum distance of 0.1 m complied with? |
| E2 | O3 | Free space from the surroundings | Is a minimum distance of 0.1 m complied with? |
| E2 | O1 | Free space from the surroundings | Is a minimum distance of 0.1 m complied with? |

The invention claimed is:

1. A computer-aided method for compiling a digital mockup for modeling installation of a multiplicity of objects in an installation space and for fitting out the installation space with a multiplicity of objects, the method comprising the steps of:
   a) assigning an object type to each object in said multiplicity of objects;
   b) allocating an installation location in said installation space for each object in said multiplicity of objects,
   c) carrying out a vicinity search around the installation location for each object in order to determine neighboring objects and to compile a first dataset containing the neighboring objects for each object in said installation space,
   wherein the determination of neighboring objects is carried out by means of a bounding-box method wherein the bounding box is formed as a cuboid enclosing the object, and wherein said cuboid enclosing the object is extended in one or more spatial directions relative to the enclosed object by from 0.1 to 1 m,
   d) using a second dataset which, for each object type, contains queries about possible interactions with other object types,
   e) for each object, compiling and outputting a query list that contains queries from the second dataset for those objects identified as neighboring objects in the first dataset,
   f) compiling a digital mockup of the fitted-out installation space, and
   g) fitting out the installation space by arranging objects at installation locations in said installation space according to said digital mockup.

2. The method of claim 1, wherein the first and/or the second dataset is a two-dimensional matrix.

3. The method claim 1, wherein the queries about possible interactions of one object type with other object types are selected from the following categories:
   a) whether the function is ensured,
   b) whether there is enough free space from the surroundings,
   c) whether there are interfaces, and whether these interfaces are compatible with one another,
   d) whether the object is mountable,
   e) whether the object is accessible for maintenance purposes, and
   f) whether the object is accessible and controllable.

4. The method of claim 1, wherein the following further steps are carried out:
   a) allocating a new installation location for an object for which the response to the query list output in step e) of claim 1 reveals a collision with another object,
   b) optionally iterative repetition of steps a) to f) of claim 3, until the response to the query list output in step e) of claim 1 reveals no collision of objects.

5. The method of claim 1, wherein the installation space is the interior of an airplane.

6. The method of claim 1, wherein said installation space is the interior of an airplane.

7. The method of claim 1, wherein said cuboid enclosing the object is extended in one or more spatial directions relative to the enclosed object by from 0.2 to 0.7 m.

8. The method of claim 1, wherein said cuboid enclosing the object is extended in one or more spatial directions relative to the enclosed object by from 0.4 to 0.6 m.

* * * * *